US008957676B2

(12) United States Patent
David et al.

(10) Patent No.: US 8,957,676 B2
(45) Date of Patent: Feb. 17, 2015

(54) MAGNETIC FIELD SENSOR HAVING A CONTROL NODE TO RECEIVE A CONTROL SIGNAL TO ADJUST A THRESHOLD

(75) Inventors: Paul David, Bow, NH (US); Andreas P. Friedrich, Metz-Tessy (FR); Gary T. Pepka, Pembroke, NH (US); Nevenka Kozomora, Manchester, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 563 days.

(21) Appl. No.: 13/102,449

(22) Filed: May 6, 2011

(65) Prior Publication Data
US 2012/0280681 A1 Nov. 8, 2012

(51) Int. Cl.
G01R 33/00 (2006.01)
H03K 17/95 (2006.01)

(52) U.S. Cl.
CPC ........ G01R 33/0029 (2013.01); H03K 17/9517 (2013.01); *H03K 2217/94021* (2013.01)
USPC ............................ 324/244; 324/251; 324/252

(58) Field of Classification Search
CPC G01R 33/0023–33/0041; G01R 33/06–33/10; H03K 17/9517; H03K 2217/94021
USPC ............................ 324/202, 244, 251, 252, 260
See application file for complete search history.

(56) References Cited

U.S. PATENT DOCUMENTS

| 4,687,622 | A | * | 8/1987 | Longden ........................ 376/254 |
| 4,908,527 | A |   | 3/1990 | Van Antwerp |
| 5,045,832 | A | * | 9/1991 | Tam ............................... 338/334 |
| 5,194,766 | A | * | 3/1993 | Sugawara ........................ 326/60 |
| 5,339,067 | A | * | 8/1994 | Harris et al. ................... 338/323 |
| 5,493,218 | A | * | 2/1996 | Hayashi et al. ........... 324/207.21 |
| 5,594,894 | A | * | 1/1997 | Mitra ............................. 713/501 |
| 5,621,319 | A |   | 4/1997 | Bilotti et al. |
| 6,154,027 | A | * | 11/2000 | Alexander et al. ............. 324/251 |
| 6,275,422 | B1 | * | 8/2001 | Javanifard et al. ....... 365/189.07 |

(Continued)

FOREIGN PATENT DOCUMENTS

GB          2 107 070 A       4/1983
WO    WO 2013/017211 A1      2/2013

OTHER PUBLICATIONS

PCT Search Report and Written Opinion of the ISA for PCT Pat. App. No. PCT/2012/032693; dated Jun. 18, 2012; 12 pages.

(Continued)

Primary Examiner — Huy Q Phan
Assistant Examiner — James Split
(74) Attorney, Agent, or Firm — Daly, Crowley, Mofford & Durkee, LLP

(57) ABSTRACT

An integrated magnetic field sensor includes a magnetic field sensing element configured to generate a magnetic field sensing element output signal in response to a magnetic field. The integrated magnetic field sensor also includes a threshold control node configured to receive a control signal from outside of the integrated magnetic field sensor, wherein the integrated magnetic field sensor is configured to provide an adjustable threshold signal in response to the control signal. The integrated magnetic field sensor also includes a comparator having a first input node coupled to receive a first signal representative of the magnetic field sensing element output signal, a second input node coupled to receive a second signal representative of the adjustable threshold signal, and an output node at which is generated an output signal responsive to the first and second signals.

10 Claims, 12 Drawing Sheets

(56) References Cited

U.S. PATENT DOCUMENTS

| | | | |
|---|---|---|---|
| 6,465,289 B1* | 10/2002 | Streit et al. | 438/167 |
| 6,573,693 B2* | 6/2003 | Okamoto | 323/273 |
| 6,646,566 B1* | 11/2003 | Tanguay | 340/815.4 |
| 6,870,698 B2* | 3/2005 | Blatchley et al. | 360/51 |
| 7,103,704 B2* | 9/2006 | Chatterjee | 710/315 |
| 7,184,876 B2 | 2/2007 | Teulings et al. | |
| 7,425,821 B2 | 9/2008 | Monreal et al. | |
| 7,495,555 B2* | 2/2009 | Seal et al. | 340/551 |
| 7,518,354 B2* | 4/2009 | Stauth et al. | 324/117 R |
| 7,552,016 B2 | 6/2009 | Vig et al. | |
| 7,659,716 B2* | 2/2010 | Nishikawa | 324/244 |
| 2008/0260137 A1* | 10/2008 | Poi et al. | 379/212.01 |
| 2009/0009164 A1* | 1/2009 | Utsuno | 324/251 |
| 2009/0079411 A1* | 3/2009 | Ariyama | 323/297 |
| 2009/0295368 A1* | 12/2009 | Doogue et al. | 324/117 H |
| 2010/0001704 A1* | 1/2010 | Williams | 323/283 |
| 2010/0013461 A1* | 1/2010 | Masubuchi et al. | 324/201 |
| 2010/0125344 A1* | 5/2010 | Gaub et al. | 700/4 |
| 2010/0127700 A1* | 5/2010 | Sugiura | 324/251 |
| 2010/0207621 A1* | 8/2010 | Yano | 324/247 |
| 2010/0211347 A1 | 8/2010 | Friedrich et al. | |
| 2010/0308815 A1* | 12/2010 | Muraoka et al. | 324/251 |

OTHER PUBLICATIONS

Allegro Microsystems, Inc. Data Sheets; Nos. A3250 and A3251; Field-Programmable, Chopper-Stabilized Unipolar Hall-Effect Switches; Oct. 15, 2002; pp. 1-15.

Romero et al.; "Magnetic Field Sensor with Improved Differentiation Between a Sensed Magnetic Field Signal and a Noise Signal;" U.S. Appl. No. 12/845,115, filed Jul. 28, 2010; 47 pages.

PCT International Preliminary Report on Patentability dated Nov. 21, 2013; for PCT Pat. App. No. PCT/US2012/032693; 10 pages.

* cited by examiner

MAGNETIC FIELD SENSOR HAVING A CONTROL NODE TO RECEIVE A CONTROL SIGNAL TO ADJUST A THRESHOLD

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors in the form of magnetic switches and, more particularly, to a magnetic switch having a control node at which a control signal is received to adjust a threshold.

BACKGROUND OF THE INVENTION

Magnetic field sensors for detecting magnetic fields are known. In a magnetic field sensor, the magnetic field is detected by a magnetic field sensing element, such as a Hall element or a magnetoresistance element, which provides a signal (i.e., a magnetic field signal) proportional to a detected magnetic field. In some arrangements, the magnetic field signal is an electrical signal.

Magnetic field sensors are used in a variety of applications, including, but not limited to, a linear magnetic field sensor that senses a magnetic field density of a magnetic field, a current sensor that senses a magnetic field generated by a current flowing in a current carrying conductor, a magnetic switch that senses the proximity of a ferromagnetic object, and a rotation detector that senses passing ferromagnetic articles.

For a linear magnetic field sensor, the output signal changes in direct proportion to the sensed magnetic field. For a magnetic switch, the output signal changes state in response to a magnitude of the sensed magnetic field being above or below a predetermined value.

In particular, the magnetic switch uses a threshold voltage representative of a magnetic field, below which an output signal from the magnetic switch takes on a first state (e.g., a low state), and above which the output signal takes on a second different state (e.g., a high state). The threshold voltage is conventionally generated internal to the magnetic switch, and thus, is not subject to change after the magnetic switch is manufactured.

It would be desirable to have a magnetic switch for which a threshold voltage is provided in accordance with a control signal from outside the magnetic switch.

SUMMARY OF THE INVENTION

The present invention provides a magnetic field sensor as a magnetic switch having a comparator to which a threshold voltage is provided as an adjustable threshold voltage in accordance with a control signal provided from outside of the magnetic switch.

In accordance with one aspect of the present invention, an integrated magnetic field sensor includes a magnetic field sensing element configured to generate a magnetic field sensing element output signal in response to a magnetic field. The integrated magnetic field sensor also includes a threshold control node configured to receive a control signal from outside of the integrated magnetic field sensor, wherein the integrated magnetic field sensor is configured to provide an adjustable threshold signal in response to the control signal. The integrated magnetic field sensor also includes a comparator having a first input node coupled to receive a first signal representative of the magnetic field sensing element output signal, a second input node coupled to receive a second signal representative of the adjustable threshold signal, and an output node at which is generated an output signal responsive to the first and second signals.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall elements, magnetoresistance elements, or magnetotransistors. As is known, there are different types of Hall elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. As described above, magnetic field sensors are used in a variety of applications, including, but not limited to, a magnetic field sensor that senses a magnetic field density of a magnetic field, a current sensor that senses a magnetic field generated by a current flowing in a current carrying conductor, a magnetic switch that senses the proximity of a ferromagnetic object, and a rotation detector that senses passing ferromagnetic articles.

Some types of linear magnetic field sensor are described in U.S. Pat. No. 5,621,319, issued Apr. 15, 1997, and U.S. Pat. No. 7,425,821, issued Sep. 16, 2008, which are assigned to the assignee of the present invention, and which are incorporated herein by reference in their entirety.

Magnetic field sensors that use Hall effect elements (Hall elements) are used in most examples herein. However, the techniques are also applicable to magnetic field sensors that use other types of magnetic field sensing elements, for example, magnetoresistance elements.

Figure 1:
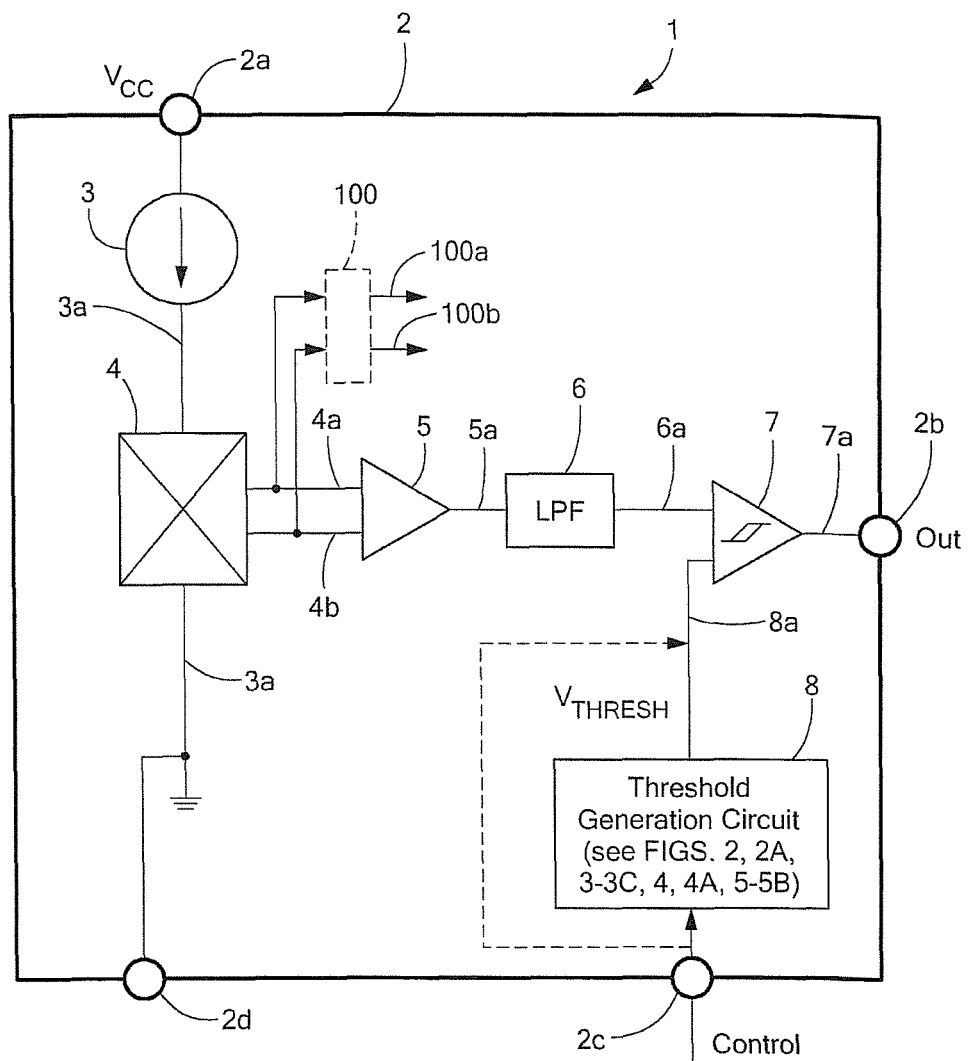
FIG. 1 is a block diagram showing a magnetic field sensor in the form of a magnetic switch having a Hall element, an output comparator, a threshold control node, and a threshold generation circuit coupled to the threshold control node to receive a control signal from outside of the magnetic field sensor, wherein the threshold generation circuit is configured to generate an adjustable threshold signal received by the comparator.

Referring to FIG. 1, a magnetic field sensor 1, in the form a magnetic switch, is formed on a semiconductor substrate 2, for example, a silicon substrate. The substrate 2 includes at least four nodes, a node 2a at which the magnetic field sensor 1 is coupled to receive a power supply voltage, Vcc, a node 2b at which the magnetic field sensor 1 generates an output signal 7a, a node 2c, at which the magnetic field sensor 1 is coupled to receive a control signal, and a node 2d, at which the magnetic field sensor 1 is coupled to a ground or other reference voltage.

The magnetic field sensor 1 can include a current source 3 coupled to receive the power supply voltage, Vcc, and configured to generate a current signal 3a. A Hall effect element 4, which, in some embodiments, is a four terminal device, can be coupled to receive the current signal 3a at one node and output the current signal 3a to a node coupled to a reference voltage, for example, a ground reference voltage.

The Hall effect element 4 is configured to generate a magnetic field sensing element output signal, a differential signal 4a, 4b, which has a magnitude responsive to a magnetic field proximate to the Hall effect element 4. An amplifier 5 is coupled to receive the magnetic field sensing element differential output signal 4a, 4b and configured to generate an amplified signal 5a. A filter 6, for example, a low pass filter (LPF), is coupled to receive the amplified signal 5a and configured to generate a filtered signal 6a. A comparator 7 is coupled to receive the filtered signal 6a and configured to generate the output signal 7a at the node 2b.

As described above, the magnetic field sensor 1 is coupled to receive a control signal at the node 2c. A threshold generation circuit 8 is coupled to receive the control signal and configured to generate a signal 8a, which is referred to here as an "adjustable threshold signal."

The comparator 7 is coupled to receive the adjustable threshold signal 8a as a threshold signal.

In operation, the control signal can be provided to the magnetic field sensor 1 either continuously or it can be provided from time to time. In either case, the threshold generation circuit 8 can process the control signal to continuously provide the adjustable threshold signal 8a. The output signal 7a changes state when a value of the filtered signal 6a crosses a value of the adjustable threshold signal 8a. Thus, the output signal 7a can be responsive to different levels of magnetic field to which the Hall element 4 is responsive, depending upon the value of the adjustable threshold signal 7a.

It will be recognized that the control signal is provided by other circuits and the control signal can be provided one time, or at any time, continuously or dynamically, as the magnetic field sensor 1 is in operation.

In some embodiments, the control signal provided at the node 2c provides the adjustable threshold signal 8a directly, and the threshold generation circuit 8 is not used, or has only a very simple form, for example, a filter. Such an arrangement is represented by a phantom line.

The magnetic field sensor 1 of FIG. 1 is shown having a simple form, not having so-called "chopping" of the Hall effect element 4. However, in some embodiments, the magnetic field sensor 1 can include an optional modulation circuit 100 coupled to receive the differential signal 4a, 4b, and configured to generate a differential chopped signal 100a, 100, which is received by the amplifier 5 in place of the differential signal 4a, 4b.

Chopping is a technique that can reduce DC offset voltages that tend to be generated by a Hall effect element. The DC offset voltages result in the Hall element 4 generating the differential output signal 4a, 4b that is not representative of a zero magnetic field when the Hall element 4 experiences a zero magnetic field. Magnetic field sensors that include chopping provided by respective modulation switches can be found, for example, in U.S. patent application Ser. No. 12/845,115, filed Jul. 28, 2010, assigned to the assignee of the present invention, and incorporated by reference herein in its entirety.

Also described in the above-described U.S. patent application Ser. No. 12/845,115, filed Jul. 28, 2010, as well as in above-described U.S. Pat. No. 5,621,319, issued Apr. 15, 1997, and U.S. Pat. No. 7,425,821, issued Sep. 16, 2008, the amplifier 5 can take on a variety of more complex forms, for example, a chopper-stabilized amplifier or an amplifier having sample and hold modules. Similarly, the filter 6 can take on a variety of more complex forms, for example, a discrete time selective filter and/or an anti-aliasing filter.

In some alternate embodiments, the signal 5a can be digitized by an analog-to-digital converter (not shown), the filter 6 can be a digital filter, the comparator can be a digital circuit, and the threshold signal 8a can also be a digital signal.

Figure 1A:
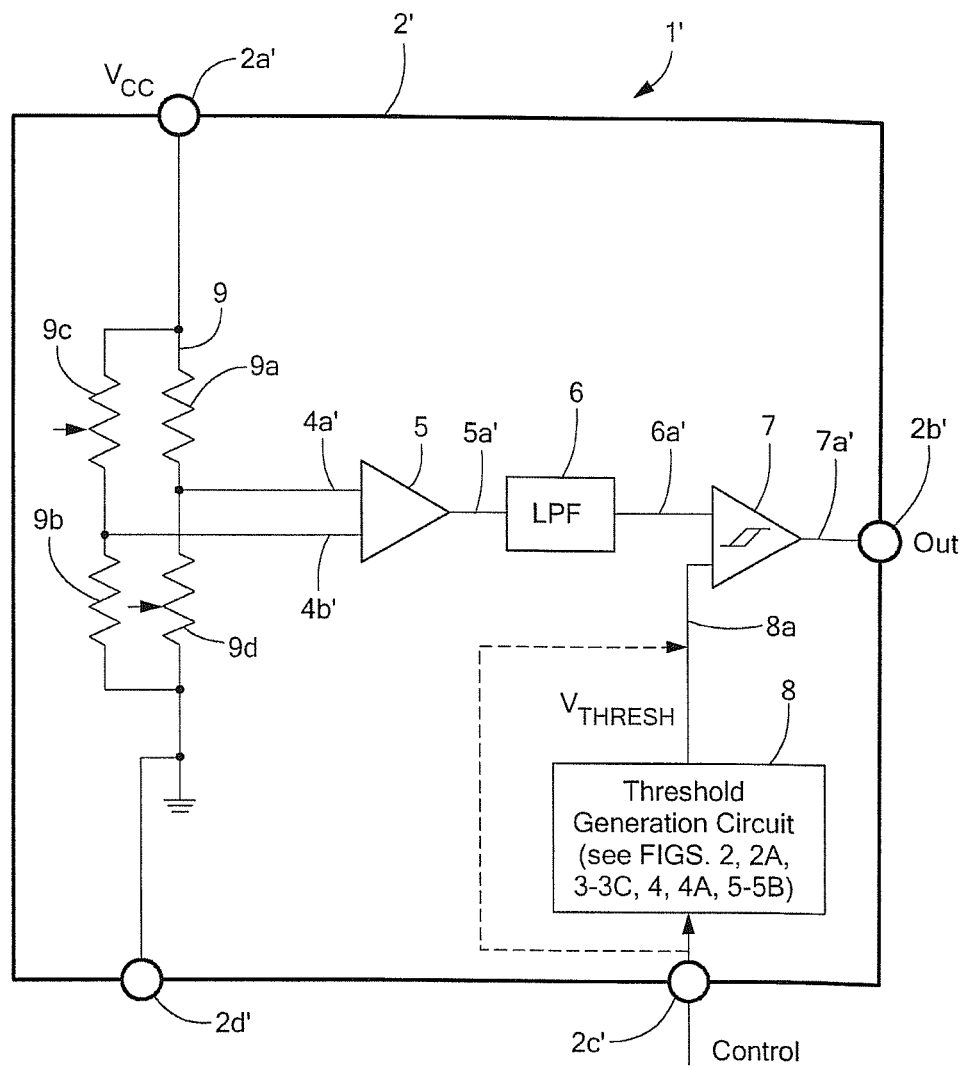
FIG. 1A is a block diagram showing another magnetic field sensor in the form of a magnetic switch having a two magnetoresistance elements, an output comparator, a threshold control node, and a threshold generation circuit coupled to the threshold control node to receive a control signal from outside of the magnetic field sensor, wherein the threshold generation circuit is configured to generate an adjustable threshold signal received by the comparator.

Referring now to FIG. 1A, in which like elements of FIG. 1 are shown having like reference designations, a magnetic field sensor 1', also in the form a magnetic switch, is formed on a semiconductor substrate 2'. The substrate 2' includes at least four nodes, a node 2a' at which the magnetic field sensor 1' is coupled to receive the above described power supply voltage, Vcc, a node 2b' at which the magnetic field sensor 1' generates an output signal 7a', a node 2c', at which the magnetic field sensor 1' is coupled to receive the above-described control signal, and a node 2d', at which the magnetic field sensor 1' is coupled to the ground or other reference voltage.

Instead of the Hall effect element 4 of FIG. 1, the magnetic field sensor 1' includes two magnetoresistance elements 9c, 9d, coupled in a Wheatstone bridge 9 with two fixed resistors 9a, 9b, resulting in a differential output signal 4a', 4b', which has a magnitude responsive to a magnetic field proximate to the magnetoresistance elements 9c, 9d. In this embodiment, the magnetoresistance elements 9c, 9d can be disposed on the substrate 2 in the same magnetically directive direction, and each can have the same polarity so that their resistances tend to move in the same direction in response to a magnetic field. Other arrangements of magnetoresistance elements are also possible, including, but not limited to, configurations that use one magnetoresistance element, two magnetoresistance elements, or four active magnetoresistance elements.

Other elements and operation of the magnetic field sensor 1' are like the other elements and operation of the magnetic field sensor 1 of FIG. 1, and are not discussed further.

Figure 2:
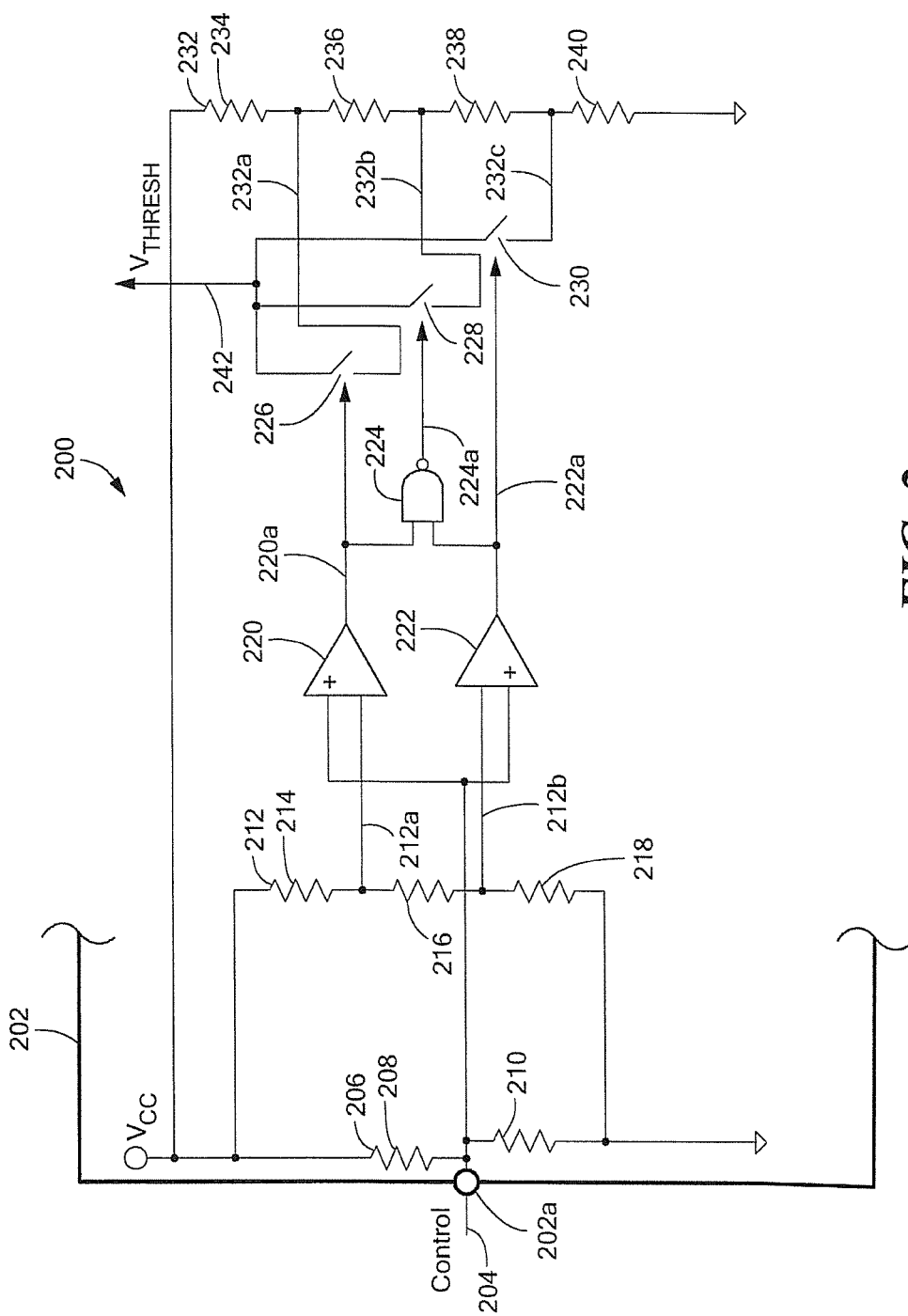
FIG. 2 is a block diagram showing a magnetic field sensor including an exemplary threshold generation circuit that can be used as the threshold generation circuit of FIGS. 1-1A.

Referring now to FIG. 2, a magnetic field sensor includes a threshold generation circuit 200 disposed upon a substrate 202 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 200.

The threshold generation circuit 200 is coupled to receive a control signal 204 at a control node 202a and configured to generate an adjustable threshold signal 242 internal to the magnetic field sensor. The control signal 204 and the control node 202a can be the same as or similar to the control signals and control nodes 2c, 2c' described above in conjunction with FIGS. 1-1A, and the adjustable threshold signal 242 can be the same as or similar to the adjustable threshold signal 8a described above in conjunction with FIGS. 1-1A. Other substrate nodes shown in FIGS. 1-1A are not shown here for clarity.

The control signal 204 can be supplied, for example, from outside of the magnetic field sensor by a user of the magnetic field sensor. In some embodiments, the control signal 204 can be a two state signal, which has a high voltage state or a low voltage state, resulting in two adjustable thresholds as described below. In other embodiments the control signal 204 can be a tri-state signal, which has a high voltage state, a low voltage state, or a high impedance state, resulting in three adjustable thresholds as described below.

The threshold generation circuit 200 can include a first resistor ladder 206 having two resistors 208, 210 coupled in series between a power supply voltage, Vcc, and a reference voltage, for example a ground reference voltage. A junction node between the two resistors 208, 210 can be coupled to the control node 202a, and is intended to hold a voltage at the control node 202a at a predetermined level when the control signal 204 becomes high impedance (tri-state) as described below.

The threshold generation circuit 200 can also include a second resistor ladder 212 having three resistors 214, 216, 218 coupled in series between the power supply voltage, Vcc, and the reference voltage, e.g., ground. A first reference voltage signal 212a is generated at a first junction node of the resistor ladder 212 and a second different reference voltage signal 212b is generated at a second junction node of the resistor ladder 212.

A first comparator 220 is coupled to receive the first reference voltage signal 212a and a second comparator 222 is coupled to receive the second reference voltage signal 212b. The first and second comparators 220, 222 are also coupled to receive the control signal 204.

The first comparator 220 is configured to generate a first comparison signal 220a and the second comparator 222 is configured to generate a second comparison signal 222a, which are both received by a gate, for example, a NAND gate 224. The NAND gate 224 is configured to generate a signal 224a.

It will be recognized that the first and second comparators 220, 222 and the NAND gate 224 form a window comparator described more fully below.

The threshold generation circuit 200 also includes first, second and third switches 226, 228, 230, respectively, coupled to receive, at respective control nodes, the signals 220a, 224a, 222a, respectively.

The threshold generation circuit 200 can also include a third resistor ladder 232 having four resistors 234, 236, 238, 240 coupled in series between the power supply voltage, Vcc, and the reference voltage, e.g., ground.

A first threshold voltage signal 232a is generated at a first junction node of the resistor ladder 232, a second different threshold voltage signal 232b is generated at a second junction node of the resistor ladder 232, and a third different threshold voltage signal 232c is generated at a third junction node of the resistor ladder 232.

At respective input nodes, the first, second, and third switches 226, 228, 230, respectively, are coupled to receive the first threshold voltage signal 232a, the second threshold voltage signal 232b, and the third threshold voltage signal 232c, respectively. Output nodes of the first, second, and third switches 226, 228, 230 are coupled together and early the adjustable threshold signal 242.

In operation, if the control signal 204 takes on a high voltage state, only the switch 226 is closed and the adjustable threshold signal 242 becomes the first threshold voltage signal 232a. If the control signal 204 takes on a low voltage state, only the switch 230 is closed and the adjustable threshold signal 242 becomes the third threshold voltage signal 232c. If the control signal 204 takes on a high impedance state (tristate), only the switch 228 is closed and the adjustable threshold signal 242 becomes the second threshold voltage signal 232b.

In this way, by way of three states, the control signal 204 can control the adjustable threshold signal 242 to be one of three voltages determined by the third resistor ladder 232.

Figure 2A:
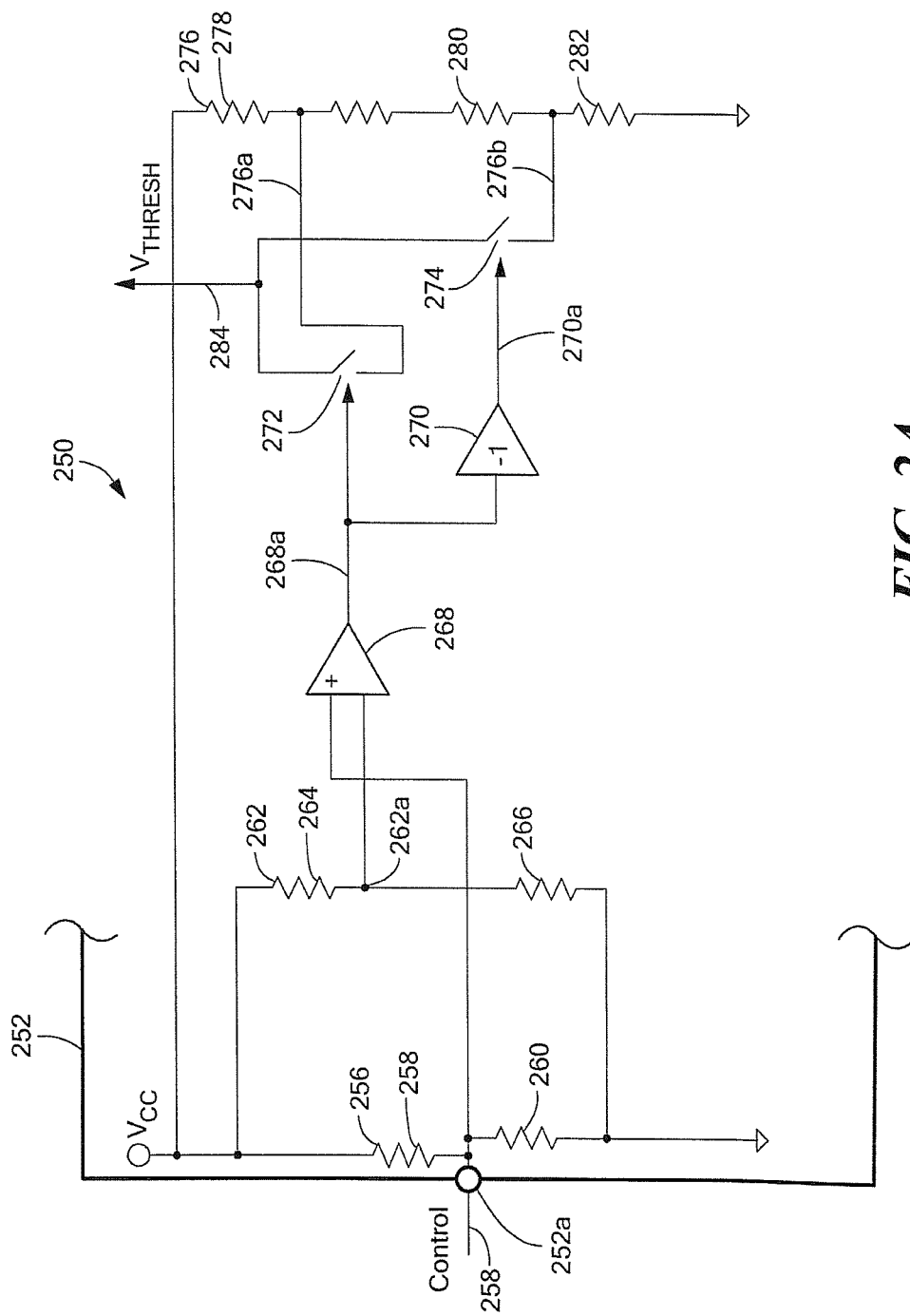
FIG. 2A is a block diagram showing another magnetic field sensor including another exemplary threshold generation circuit that can be used as the threshold generation circuit of FIGS. 1-1A.

Referring now to FIG. 2A, another magnetic field sensor can include a threshold generation circuit 250 disposed upon a substrate 252 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 250.

The threshold generation circuit 250 is coupled to receive a control signal 254 at a control node 252a and configured to generate an adjustable threshold signal 284 internal to the magnetic field sensor. The control signal 254 and the control node 252a can be the same as or similar to the control signals and control nodes 2c, 2c' described above in conjunction with FIGS. 1-1A, and the adjustable threshold signal 284 can be the same as or similar to the adjustable threshold signal 8a described above in conjunction with FIGS. 1-1A. Other substrate nodes shown in FIGS. 1-1A are not shown here for clarity.

The control signal 254 can be supplied, for example, from outside of the magnetic field sensor by a user of the magnetic field sensor. In some embodiments, the control signal 254 can be a two state signal, which has a high voltage state or a low voltage state, resulting in two adjustable thresholds as described below.

The threshold generation circuit 250 can include an optional first resistor ladder 256 having two resistors 258, 260 coupled in series between a power supply voltage, Vcc, and a reference voltage, for example a ground reference voltage. A junction node between the two resistors 258, 260 can be coupled to the control node 252a, and is intended to hold a voltage at the control node 252a at a predetermined level when there is no control signal 254 coupled to the control node 252a.

The threshold generation circuit 250 can also include a second resistor ladder 262 having two resistors 264, 266 coupled in series between the power supply voltage, Vcc, and the reference voltage, e.g., ground. A reference voltage signal 262a is generated at a junction node of the resistor ladder 262.

A comparator 268 is coupled to receive the reference voltage signal 262a. The comparator 268 is also coupled to receive the control signal 254.

The comparator 268 is configured to generate a comparison signal 268a, which is received by an inverter 270, The inverter 270 is configured to generate a signal 270a.

The threshold generation circuit 250 also includes first and second switches 272, 274, respectively, coupled to receive, at respective control nodes, the signals 268a, 270a, respectively.

The threshold generation circuit 250 can also include a third resistor ladder 276 having three resistors 278, 280, 282 coupled in series between the power supply voltage, Vcc, and the reference voltage, e.g., ground.

A first threshold voltage signal 276a is generated at a first junction node of the resistor ladder 276 and a second different threshold voltage signal 276b is generated at a second junction node of the resistor ladder 276.

At respective input nodes, the first and second switches 272, 274, respectively, are coupled to receive the first threshold voltage signal 276a and the second threshold voltage signal 276b, respectively. Output nodes of the first and second switches 272, 274 are coupled together and carry the adjustable threshold signal 284.

In operation, if the control signal 254 takes on a high voltage state, only the switch 272 is closed and the adjustable threshold signal 284 becomes the first threshold voltage signal 276a. If the control signal 254 takes on a low voltage state, only the switch 274 is closed and the adjustable threshold signal 284 becomes the second threshold voltage signal 276b.

In this way, by way of two states, the control signal 254 can control the adjustable threshold signal 284 to be one of two voltages determined by the third resistor ladder 276.

Figure 3:
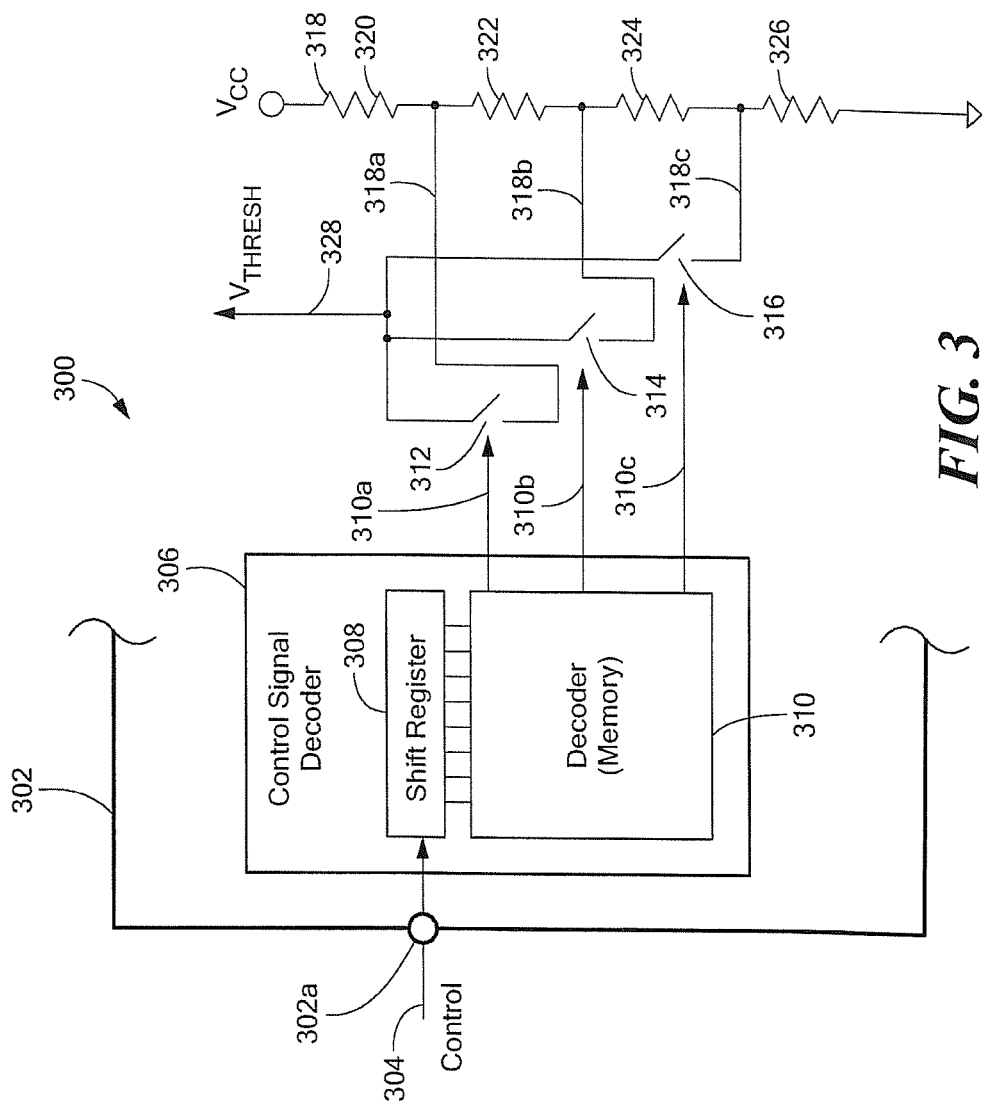
FIG. 3 is a block diagram showing another magnetic field sensor including another exemplary threshold generation circuit that can be used as the threshold generation circuit of FIGS. 1-1A.

Referring now to FIG. 3, another magnetic field sensor can include a threshold generation circuit 300 disposed upon a substrate 302 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 300.

The threshold generation circuit 300 is coupled to receive a control signal 304 at a control node 302a and configured to generate an adjustable threshold signal 328 internal to the magnetic field sensor. The control signal 304 and the control node 302a can be the same as or similar to the control signals and the control nodes 2c, 2c' described above in conjunction with FIGS. 1-1A, and the adjustable threshold signal 328 can be the same as or similar to the adjustable threshold signal 8a described above in conjunction with FIGS. 1-1A. Other substrate nodes shown in FIGS. 1-1A are not shown here for clarity.

The control signal 304 can be supplied, for example, from outside of the magnetic field sensor by a user of the magnetic field sensor. In some embodiments, the control signal 304 can be a serial digital signal having a plurality of bits. In some other embodiments, the control signal 304 can be a parallel digital signal having a plurality of bits. In embodiments, the control signal 304 can be a digital signal having a format selected from among a CAN format, an I2C format, a SIP format, a SENT format, and a BISS format.

The threshold generation circuit 300 can include a shift register 308 (or a parallel register where the control signal comprises parallel bits) coupled to receive the control signal 304. The threshold generation circuit 300 can also include a decoder circuit 310 coupled to receive a signal from the shift register 308 and configured to decode the signal to provide one or more decoded signals, for example, first, second, and third decoded signals 310a, 310b, 310c, respectively.

The threshold generation circuit 300 also includes first, second and third switches 312, 314, 316, respectively, coupled to receive, at respective control nodes, the decoded signals 310a, 310b, 310c.

The threshold generation circuit 300 can also include a resistor ladder 318 having four resistors 320, 322, 324, 326 coupled in series between a power supply voltage, Vcc, and a reference voltage, e.g., ground.

A first threshold voltage signal 318a is generated at a first junction node of the resistor ladder 318, a second different threshold voltage signal 318b is generated at a second junction node of the resistor ladder 318, and a third different threshold voltage signal 318c is generated at a third junction node of the resistor ladder 318.

At respective input nodes, the first, second, and third switches 312, 314, 316, respectively, are coupled to receive the first threshold voltage signal 318a, the second threshold voltage signal 318b, and the third threshold voltage signal 318b, respectively. Output nodes of the first, second, and third switches 312, 314, 316 are coupled together and carry the adjustable threshold signal 328.

In some alternate arrangements, the decoder 310 is not used and the signal (i.e., bits) from the shift register 308 is instead coupled directly to the switches 312, 314, 316.

In operation, if the control signal 304 takes on a first digital value, only the switch 312 is closed and the adjustable threshold signal 328 becomes the first threshold voltage signal 318a. If the control signal 304 takes on a second different digital value, only the switch 314 is closed and the adjustable threshold signal 328 becomes the second threshold voltage signal 318b. If the control signal 304 takes on a third different digital value, only the switch 316 is closed and the adjustable threshold signal 328 becomes the third threshold voltage signal 318c.

In this way, by way of three digital values of the control signal 304, the control signal 304 can control the adjustable threshold signal 328 to be one of three voltages determined by the resistor ladder 318.

In other arrangements, it will be understood that there can be more than or fewer than three switches with respective control and input signals.

Figure 3A:
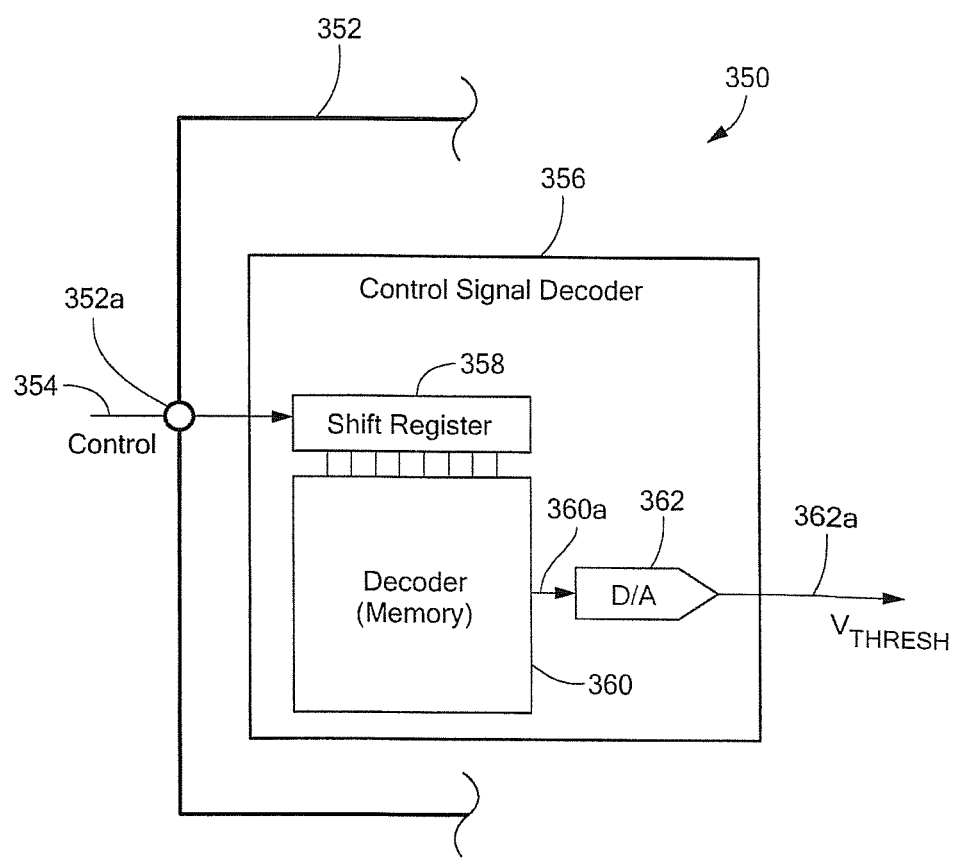
FIG. 3A is a block diagram showing another magnetic field sensor including another exemplary threshold generation circuit that can be used as the threshold generation circuit of FIGS. 1-1A.

Referring now to FIG. 3A, another magnetic field sensor can include a threshold generation circuit 350 disposed upon a substrate 352 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 350.

The threshold generation circuit 350 is coupled to receive a control signal 354 at a control node 352a and configured to generate an adjustable threshold signal 362a internal to the magnetic field sensor. The control signal 354 and the control node 352a can be the same as or similar to the control signals and the control nodes 2c, 2c' described above in conjunction with FIGS, 1-1A, and the adjustable threshold signal 362a can be the same as or similar to the adjustable threshold signal 8a described above in conjunction with FIGS. 1-1A. Other substrate nodes shown in FIGS. 1-1A are not shown here for clarity.

The control signal 354 can be supplied, for example, from outside of the magnetic field sensor by a user of the magnetic field sensor. In some embodiments, the control signal 354 can be a serial digital signal having a plurality of bits. In some other embodiments, the control signal 354 can be a parallel digital signal having a plurality of bits.

The threshold generation circuit 350 can include a shift register 358 (or a simple register where the control signal 354 has parallel bits) coupled to receive the control signal 354. The threshold generation circuit 350 can also include a decoder circuit 360 coupled to receive a signal from the shift register 358 and configured to decode the signal to provide a decoded signal 360a.

The threshold generation circuit 350 can also include a digital-to analog (D/A) converter 362 coupled to receive the signal 360a and configured to generate the adjustable threshold signal 362a.

In some alternate arrangements, the decoder 360 is not used and the signal from the shift register 358 is instead coupled directly to the D/A converter 362.

In some other alternate embodiments, the D/A converter is not used and the threshold signal 362a is a digital signal applied, for example, to a digital comparator as described above in conjunction with FIG. 1.

In operation, it will be understood that the adjustable threshold signal 362a is an analog signal that can take on a plurality of different voltage values, each in accordance with a respective digital value of the control signal 354. It will be understood that the number of voltage values of the adjustable threshold signal 362a can correspond to a number of different digital values of the control signal 354.

In some embodiments, the digital values of the control signal 354 are equally spaced and result in voltage values of the adjustable threshold signal 362a that are equally spaced accordingly. However, in some other embodiments, the digital values of the control signal 354 are not equally spaced and result in voltage values of the adjustable threshold signal 362a that are not equally spaced.

Figure 3B:
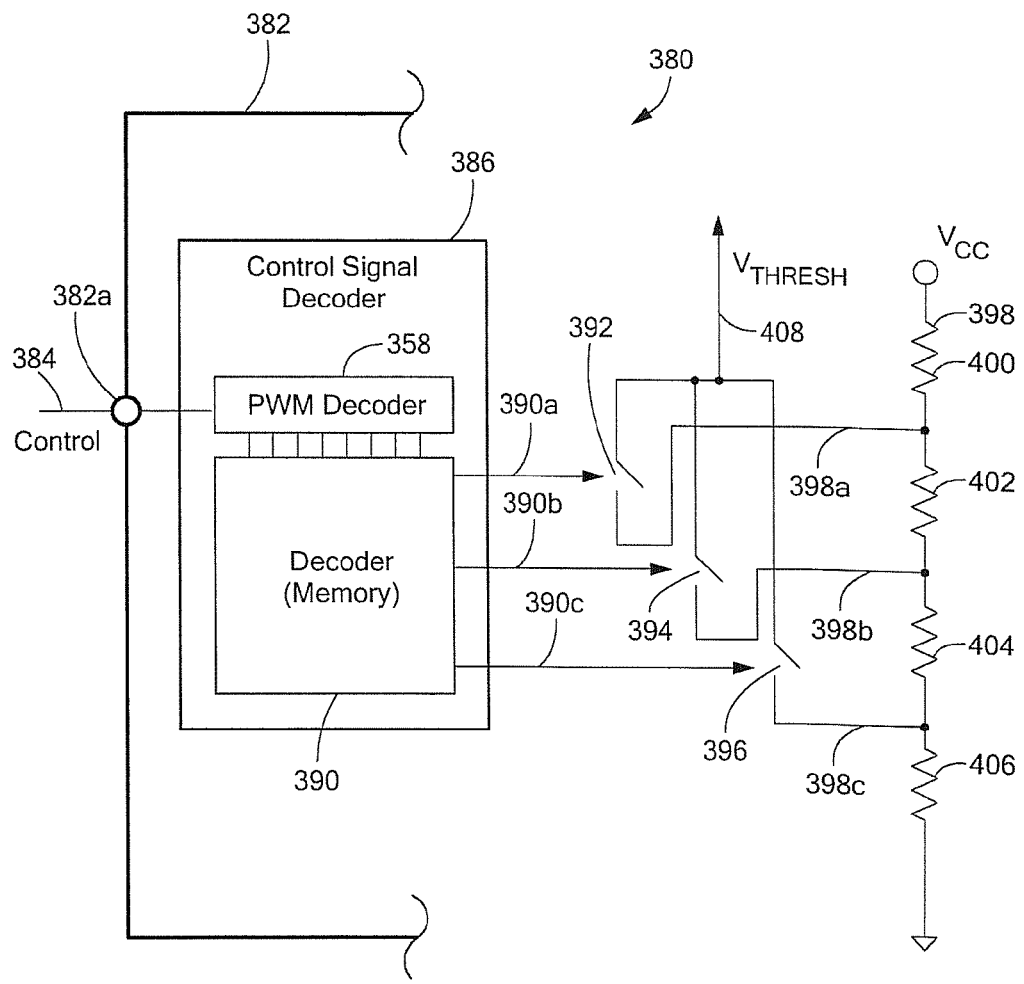
FIG. 3B is a block diagram showing another magnetic field sensor including another exemplary threshold generation circuit that can be used as the threshold generation circuit of FIGS. 1-1A.

Referring now to FIG. 3B, a threshold generation circuit 380 is like the threshold generation circuit 300 of FIG. 3. However, the threshold generation circuit 380 replaces the shift register 308 of FIG. 3 with a pulse width modulation (PWM) decoder 388 and the control signal 304 of FIG. 3 is replaced by a control signal 384, which can be a PWM signal capable of a plurality of different PWM arrangements. The adjustable threshold circuit 380 can include a decoder 390, switches 392, 394, 396 and a resistor ladder 398 with resistors 400, 402, 404, 406, all coupled in ways similar to similar elements of FIG. 3.

In some alternate arrangements, the decoder 390 is not used and the signal (i.e., bits) from the PWM decoder 388 is instead coupled directly to control nodes of switches 392, 394, 396.

In operation, if the control signal 384 takes on a first PWM arrangement, only the switch 392 is closed and an adjustable threshold signal 408 becomes a first threshold voltage signal 398a generated by the resistor ladder 398. If the control signal 384 takes on a second different PWM arrangement, only the switch 394 is closed and the adjustable threshold signal 408 becomes a second threshold voltage signal 398b. If the control signal 304 takes on a third different PWM arrangement, only the switch 396 is closed and the adjustable threshold signal 408 becomes a third threshold voltage signal 398c.

In this way, by way of three PWM arrangement of the control signal 384, the control signal 384 can control the adjustable threshold signal 408 to be one of three voltages determined by the resistor ladder 398.

Figure 3C:
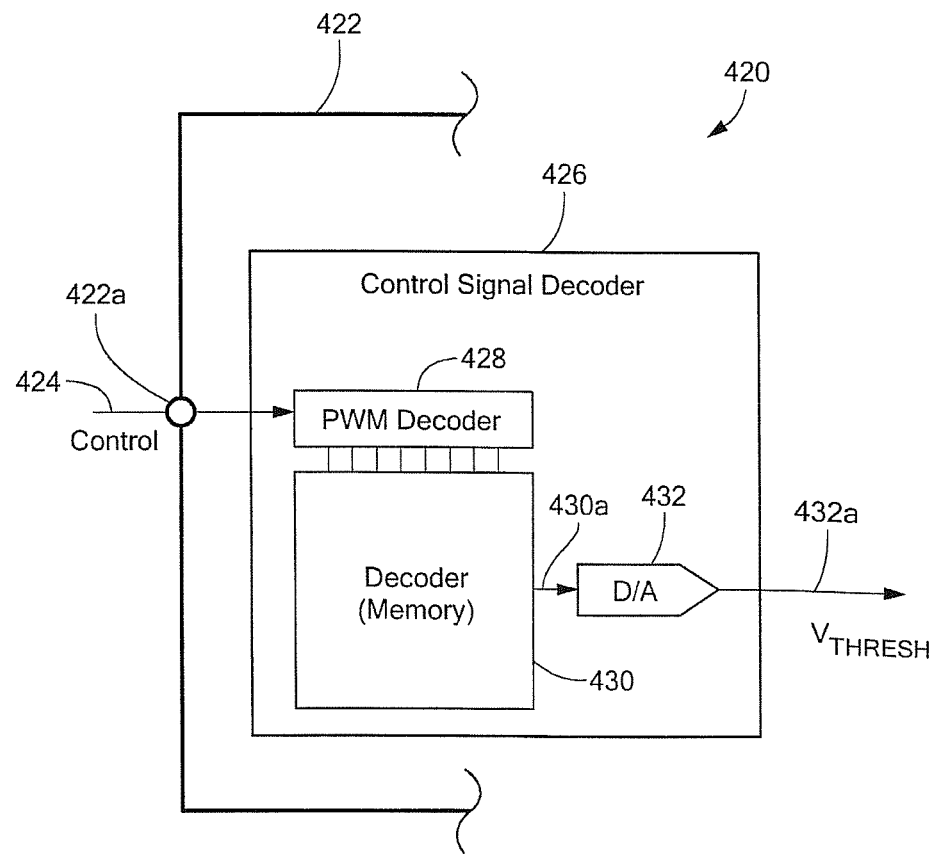
FIG. 3C is a block diagram showing another magnetic field sensor including another exemplary threshold generation circuit that can be used as the threshold generation circuit of FIGS. 1-1A.

Referring now to FIG. 3C, a threshold generation circuit 420 is like the threshold generation circuit 350 of FIG. 3A. However, the threshold generation circuit 420 replaces the shift register 358 of FIG. 3A with a pulse width modulation (PWM) decoder 428 and the control signal 354 of FIG. 3A is replaced by a control signal 424, which can be a PWM signal. The adjustable threshold circuit 420 can include a decoder 430 and a D/A converter 432 the same as or similar to the decoder 360 and the D/A converter 362 of FIG. 3A.

In some alternate arrangements, the decoder 430 is not used and the signal (i.e., bits) from the PWM decoder 428 is instead coupled directly to the D/A converter 432.

In some other alternate embodiments, the decoders 310, 360, 390, 430 of FIGS. 3, 3A, 3B, and 3C, respectively can include, or be replaced by, a memory device, such that the respective magnetic field sensor 300, 350, 380, 420 can store a threshold value indicative of the respective adjustable threshold signal 328, 362a, 408, 432a. In some embodiments, the memory device is non-volatile, for example, an EEPROM, such that the respective magnetic field sensor can retain the stored value when power is removed.

In operation, it will be understood that an adjustable threshold signal 432a is an analog signal that can take on a plurality of different voltage values in accordance with a PWM arrangement of the control signal 424. It will be understood that the number of voltage values of the adjustable threshold signal 432a can correspond to a number of different PWM arrangements of the control signal 424.

In some embodiments, the PWM arrangements of the control signal 424 are equally spaced and result in voltage values of the adjustable threshold signal 432a that are equally spaced accordingly. However, in some other embodiments, the PWM arrangements of the control signal 424 are not equally spaced and result in voltage values of the adjustable threshold signal 432a that are not equally spaced.

Figure 4:
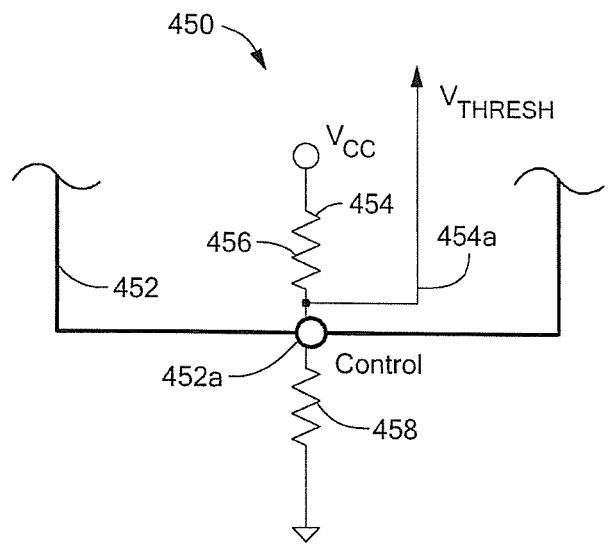
FIG. 4 is a block diagram showing another magnetic field sensor including another exemplary threshold generation circuit that can be used as the threshold generation circuit of FIGS. 1-1A and resistor means for providing the control signal at the threshold control node of the magnetic field sensors of FIGS. 1-1A.

Referring now to FIG. 4, another magnetic field sensor can include a threshold generation circuit 450, i.e., a resistor 456, coupled at one end to a control node 452a and at the other end to a voltage (e.g., Vcc). The resistor 456 is disposed upon a substrate 452 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 450 disposed upon the substrate 452.

The resistor 456 is coupled to receive a control signal at a control node 452a and configured to generate an adjustable threshold signal 454a internal to the magnetic field sensor. The control signal and the control node 452a can be the same as or similar to the control signals and control nodes 2c, 2c' described above in conjunction with FIGS. 1-1A, and the adjustable threshold signal 454a can be the same as or similar to the adjustable threshold signal 8a described above in conjunction with FIGS. 1-1A. Other substrate nodes shown in FIGS. 1-1A are not shown here for clarity.

The resistor 456 can be coupled to a resistor 458 disposed outside of the substrate 452, forming a resistor divider 454 with the resistor 456 upon the substrate 452. The resistor 458 can be coupled at one end to a voltage reference, for example, ground. A junction of the resistor divider 454 is coupled to the control node.

It will be understood that a value of the resistor 458 is related to a voltage value of the adjustable threshold signal 454a.

Figure 4A:
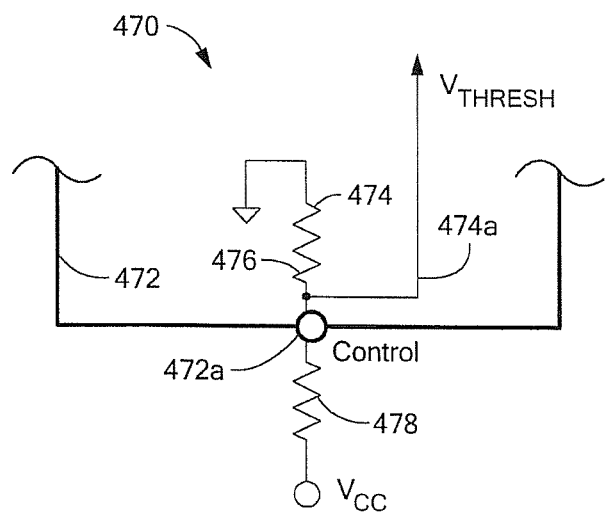
FIG. 4A is a block diagram showing another magnetic field sensor including another exemplary threshold generation circuit that can be used as the threshold generation circuit of FIGS. 1-1A and other resistor means for providing the control signal at the threshold control node of the magnetic field sensors of FIGS. 1-1A.

Referring now to FIG. 4A, a magnetic field sensor includes a threshold generation circuit, i.e., a resistor 476, coupled at one end to a control node 472a and at the other end to a reference voltage, for example, ground. The resistor 476 is disposed upon a substrate 472 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 450.

The threshold generation circuit 476 is coupled to receive a control signal at a control node 472a and configured to generate an adjustable threshold signal 474a internal to the magnetic field sensor. The control signal and the control node 472a can be the same as or similar to the control signals and control nodes 2c, 2c' described above in conjunction with FIGS. 1-1A and the adjustable threshold signal 474a can be the same as or similar to the adjustable threshold signal 8a described above in conjunction with FIGS. 1-1A. Other substrate nodes shown in FIGS. 1-1A are not shown here for clarity.

The resistor 476 can be coupled to a resistor 478 disposed outside of the substrate 472, forming a resistor divider 474 with the resistor 476 upon the substrate 452. The resistor 478 can be coupled at one end to a voltage, for example, Vcc. A junction of the resistor divider 474 is coupled to the control node.

It will be understood that a value of the resistor 478 is related to a voltage value of the adjustable threshold signal 474a.

Figure 4B:
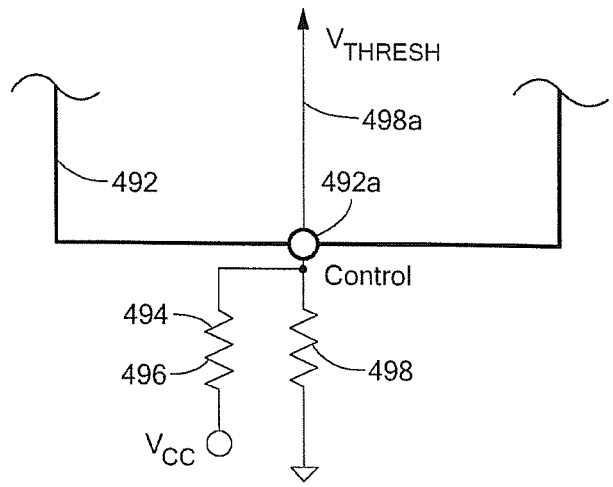
FIG. 4B is a block diagram showing another magnetic field sensor including a threshold control node and still other resistor means for providing the control signal at the threshold control node of the magnetic field sensors of FIGS. 1-1A.

Referring now to FIG. 4B, a magnetic field sensor includes no threshold generation circuit, as represented by phantom lines in FIGS. 1-1A. The overall magnetic field sensor can be of a type described above in conjunction with FIGS. 1-1A.

An adjustable threshold signal 498a, internal to the magnetic field sensor, is generated directly by a control signal applied to a control node 492a. The control signal and the control node 492a can be the same as or similar to the control signals and control nodes 2c, 2c' described above in conjunction with FIGS. 1-1A, and the adjustable threshold signal 498a can be the same as or similar to the adjustable threshold signal 8a described above in conjunction with FIGS. 1-1A. Other substrate nodes shown in FIGS. 1-1A are not shown here for clarity.

The control signal can be generated by a resistor divider 494 (or alternatively by a voltage source) disposed outside of the substrate 492. The resistor divider 494 can include resistors 496, 498 coupled between a power supply voltage, Vcc, and ground. A junction node of the resistor divider can be coupled to the control node 492a.

It will be understood that a relative value of the resistors 496, 498 is related to a voltage value of the adjustable threshold signal 498a.

Figure 5:
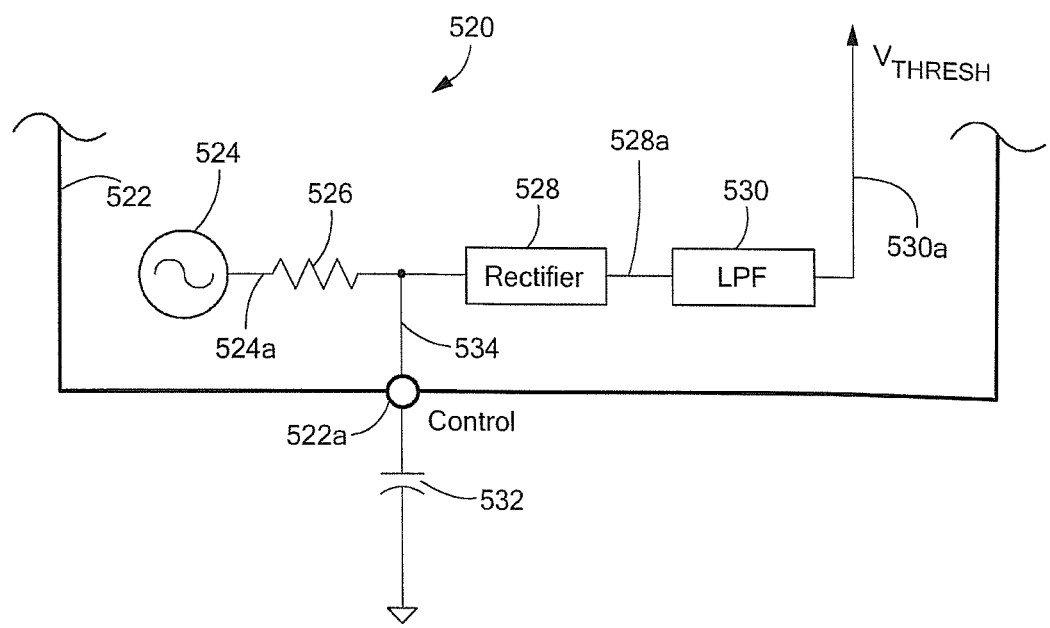
FIG. 5 is a block diagram showing another magnetic field sensor including another exemplary threshold generation circuit that can be used as the threshold generation circuit of FIGS. 1-1A and capacitor means for providing the control signal at the threshold control node of the magnetic field sensors of FIGS. 1-1A.

Referring now to FIG. 5, another magnetic field sensor can include a threshold generation circuit 520 disposed upon a substrate 522 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 520.

The threshold generation circuit 520 is coupled to receive a control signal at a control node 522a and configured to generate an adjustable threshold signal 530a internal to the magnetic field sensor. The control signal and the control node 522a can be the same as or similar to the control signals and control nodes 2c, 2c' described above in conjunction with FIGS. 1-1A, and the adjustable threshold signal 530a can be the same as or similar to the adjustable threshold signal 8a described above in conjunction with FIGS. 1-1A. Other substrate nodes shown in FIGS. 1-1A are not shown here for clarity.

The threshold generation circuit 520 can include an oscillator 524 configured to generate an AC signal 524a. A resistor 526 can be coupled to receive the AC signal 524a at one end and can be coupled to the control node 522a at the other end. The control node 522a can also be coupled to a rectifier 528, which can be coupled to a low pass filter 530. It will be recognized that the rectifier 528 and the low pass filter 530 together form an amplitude detector that can detect an amplitude of an AC signal. The low pass filter 530 provides the adjustable threshold signal 530a.

A capacitor 532 can be coupled outside of the substrate 522 to the control node 522a at one end and to a reference voltage, e.g., ground, at the other end.

In operation, the AC signal 524a is filtered by operation of the resistor 526 and the capacitor 532, resulting in a filtered AC signal 534 (a control signal) having an amplitude related to a value of the resistor 526 and a value of the capacitor 532. In other words, by selection of the value of the capacitor 532, a magnitude of the filtered AC signal 534 can be selected, which results in selection of a value of the adjustable threshold signal 530a, which is a DC signal.

Figure 5A:
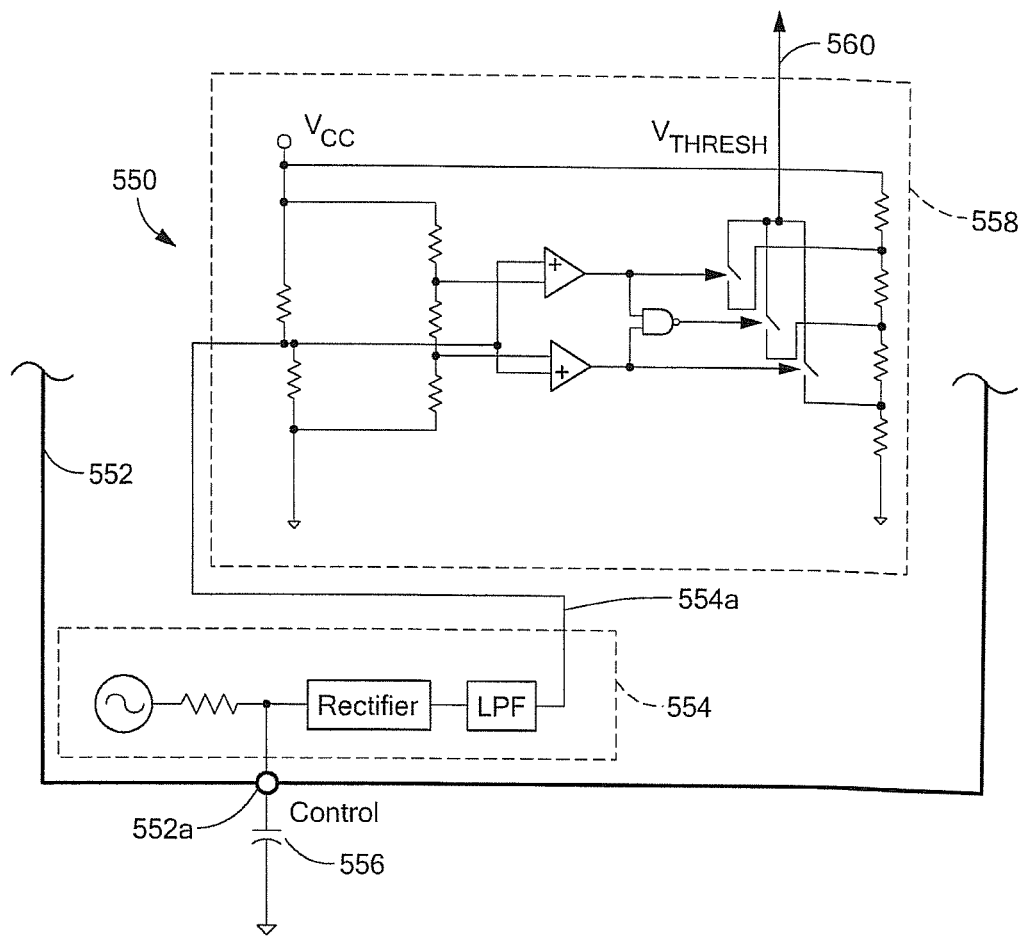
FIG. 5A is a block diagram showing another magnetic field sensor, and in particular, another exemplary threshold generation circuit that can be used as the threshold generation circuit of FIGS. 1-1A and other capacitor means for providing the control signal at the threshold control node of the magnetic field sensors of FIGS. 1-1A.

Referring now to FIG. 5A, another magnetic field sensor can include a threshold generation circuit 550 disposed upon a substrate 552 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 550.

The threshold generation circuit 550 is coupled to receive a control signal at a control node 552a and configured to generate an adjustable threshold signal 560 internal to the magnetic field sensor. The control signal and the control node 552a can be the same as or similar to the control signals and control nodes 2c, 2c' described above in conjunction with FIGS. 1-1A, and the adjustable threshold signal 560 can be the same as or similar to the adjustable threshold signal 8a described above in conjunction with FIGS. 1-1A. Other substrate nodes shown in FIGS. 1-1A are not shown here for clarity.

The threshold generation circuit 550 can include a first portion 554 having the same elements and operating in the same way as the threshold generation circuit 520 of FIG. 5 to generate a signal 554a. Like with the threshold generation circuit 520, a capacitor 556 can be coupled to the control node 552a.

The threshold generation circuit 550 can also include a second portion 558 having the same elements and operating in the same way as the threshold generation circuit 200 of FIG. 2. The second portion 558 is coupled to receive the signal 554a and configured to generate the adjustable threshold signal 560.

Operation of the threshold generation circuit 550 will be readily understood from discussion above in conjunction with FIGS. 2 and 5.

Figure 5B:
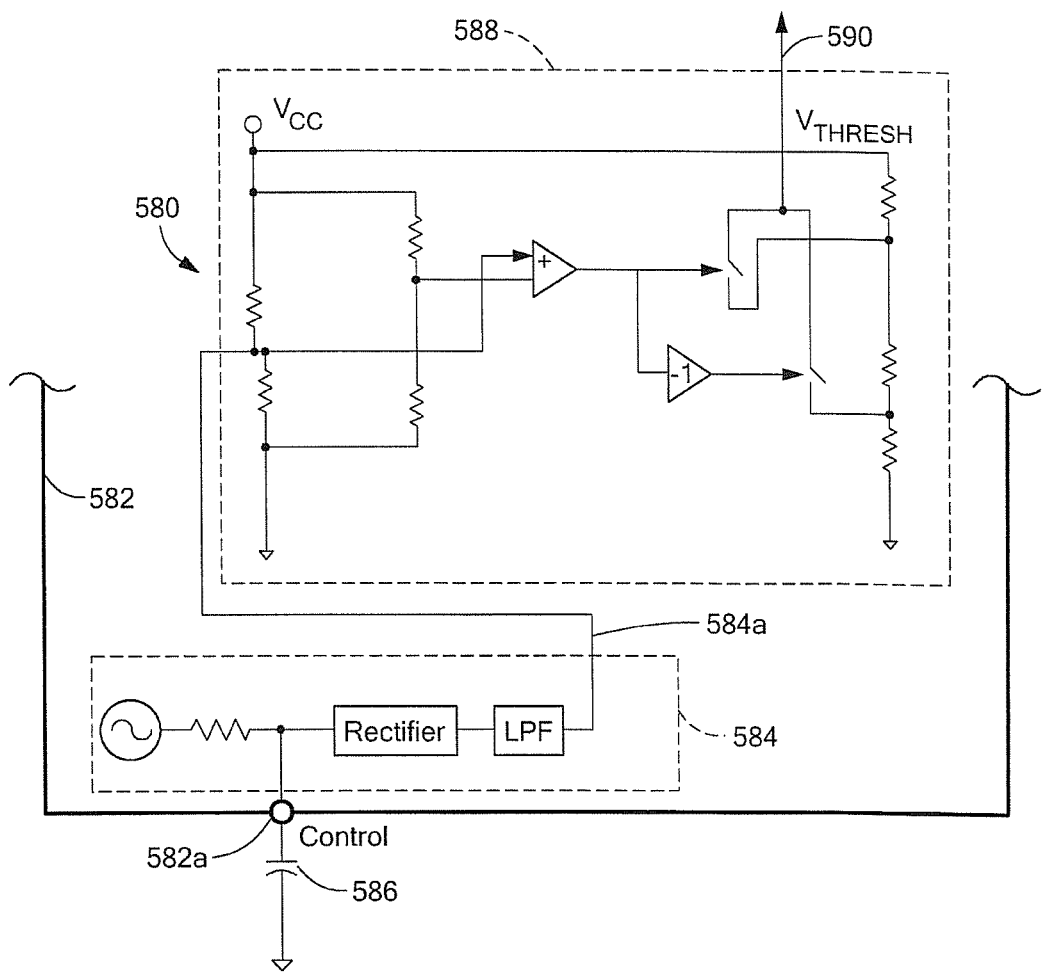
FIG. 5B is a block diagram showing another magnetic field sensor, and in particular, another exemplary threshold generation circuit that can be used as the threshold generation circuit of FIGS. 1-1A and still other capacitor means for providing the control signal at the threshold control node of the magnetic field sensors of FIGS. 1-1A.

Referring now to FIG. 5B, another magnetic field sensor can include a threshold generation circuit 580 disposed upon a substrate 582 along with other portions of the magnetic field sensor, which are not shown. The overall magnetic field sensor can be of a type described above in conjunction with FIGS. 1-1A, each of which shows a threshold generation circuit 8 that can be the same as or similar to the threshold generation circuit 580.

The threshold generation circuit 580 is coupled to receive a control signal at a control node 582a and configured to generate an adjustable threshold signal 590 internal to the magnetic field sensor. The control signal and the control node 582a can be the same as or similar to the control signals and control nodes 2c, 2c' described above in conjunction with FIGS. 1-1A, and the adjustable threshold signal 590 can be the same as or similar to the adjustable threshold signal 8a described above in conjunction with FIGS. 1-1A. Other substrate nodes shown in FIGS. 1-1A are not shown here for clarity.

The threshold generation circuit 580 can include a first portion 584 having the same elements and operating in the same way as the threshold generation circuit 520 of FIG. 5 to generate a signal 584a. Like with the threshold generation circuit 520, a capacitor 586 can be coupled to the control node 582a.

The threshold generation circuit 580 can also include a second portion 588 having the same elements and operating in the same way as the threshold generation circuit 250 of FIG. 2A. The second portion 588 is coupled to receive the signal 584a and configured to generate the adjustable threshold signal 590.

Operation of the threshold generation circuit 580 will be readily understood from discussion above in conjunction with FIGS. 2A and 5.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. An integrated magnetic field sensor, comprising:
   a magnetic field sensing element configured to generate a magnetic field sensing element output signal in response to a magnetic field;
   a comparator having a first input node coupled to receive a first signal representative of the magnetic field sensing element output signal, a second input node coupled to receive a second signal representative of an adjustable threshold signal, and an output node at which is generated an output signal responsive to the first and second signals;
   a threshold control node configured to receive a control signal from outside of the integrated magnetic field sensor; and
   a threshold generation circuit coupled between the threshold control node and the second input node of the comparator, wherein the threshold generation circuit comprises an oscillator coupled to the threshold control node, wherein the control signal comprises a AC voltage signal appearing at the threshold control node and having a magnitude related to a value of a capacitor coupled to the threshold control node and disposed outside of the integrated magnetic field sensor, wherein the threshold generation circuit is coupled to receive the control signal and configured to generate the adjustable threshold signal.

2. The integrated magnetic field sensor of claim 1, further comprising an AC to DC converter circuit coupled to the control node and configured to convert the AC voltage signal to a DC voltage signal.

3. The integrated magnetic field sensor of claim 1, wherein the DC voltage signal and the adjustable threshold signal are the same signal.

4. The integrated magnetic field sensor of claim 1, wherein the control signal and the adjustable threshold signal are dynamically adjustable during operation of the integrated magnetic field sensor.

5. The integrated magnetic field sensor of claim 1, wherein the magnetic field sensing element comprises a Hall effect element.

6. The integrated magnetic field sensor of claim 1, wherein the magnetic field sensing element comprises a magnetoresistance element.

7. The integrated magnetic field sensor of claim 1, wherein the magnetic field sensing element, the threshold control node, and the comparator are disposed on a common substrate.

8. The integrated magnetic field sensor of claim 7, wherein the control signal and the adjustable threshold signal are dynamically adjustable during operation of the integrated magnetic field sensor.

9. The integrated magnetic field sensor of claim 7, wherein the magnetic field sensing element comprises a Hall effect element.

10. The integrated magnetic field sensor of claim 7, wherein the magnetic field sensing element comprises a magnetoresistance element.

* * * * *

UNITED STATES PATENT AND TRADEMARK OFFICE
CERTIFICATE OF CORRECTION

| | |
|---|---|
| PATENT NO. | : 8,957,676 B2 |
| APPLICATION NO. | : 13/102449 |
| DATED | : February 17, 2015 |
| INVENTOR(S) | : Paul David et al. |

It is certified that error appears in the above-identified patent and that said Letters Patent is hereby corrected as shown below:

In the Specification

Column 7, Line 1, delete "early" and replace with --carry--.

Column 8, Line 47, delete "BISS format" and replace with --BiSS format--.

Column 9, Line 7, delete "318b" and replace with --318c--.

Signed and Sealed this
Fifth Day of April, 2016

Michelle K. Lee
*Director of the United States Patent and Trademark Office*